(12) United States Patent
Tolson et al.

(10) Patent No.: US 6,625,436 B1
(45) Date of Patent: Sep. 23, 2003

(54) RADIO RECEIVERS

(75) Inventors: Nigel James Tolson, Berkshire (GB); Rupert James Waldron, Reading (GB)

(73) Assignee: NEC Corporation, Tokyo (JP)

( * ) Notice: Subject to any disclaimer, the term of this patent is extended or adjusted under 35 U.S.C. 154(b) by 354 days.

(21) Appl. No.: 09/628,951

(22) Filed: Jul. 28, 2000

Related U.S. Application Data

(63) Continuation-in-part of application No. 09/413,725, filed on Oct. 7, 1999, now abandoned.

(30) Foreign Application Priority Data

Oct. 9, 1998 (GB) .............................................. 9821949

(51) Int. Cl.[7] .............................................. H03H 17/02
(52) U.S. Cl. ..................... 455/334; 455/130; 375/136; 375/197
(58) Field of Search ................................. 455/334, 303, 455/317, 339, 188.1, 189.1, 205, 207, 208, 209, 257, 265, 266, 293, 70, 73, 78, 130, 230, 296, 302, 304, 306; 375/136, 147; 331/92, 93, 96

(56) References Cited

U.S. PATENT DOCUMENTS

| | | | | |
|---|---|---|---|---|
| 4,009,450 A | * | 2/1977 | Holcomb et al. | 331/17 |
| 4,175,254 A | * | 11/1979 | Manfreda | 455/196.1 |
| 4,225,974 A | * | 9/1980 | Miyamoto | 455/207 |
| 4,661,995 A | * | 4/1987 | Kashiwagi | 455/183.2 |
| 4,885,802 A | * | 12/1989 | Ragan | 455/344 |
| 5,161,254 A | * | 11/1992 | Braathen | 455/306 |
| 5,192,918 A | * | 3/1993 | Sugiyama | 327/552 |
| 5,369,794 A | * | 11/1994 | Martineau | 455/317 |
| 5,995,815 A | * | 11/1999 | Blom | 455/189.1 |
| 6,035,186 A | * | 3/2000 | Moore et al. | 455/313 |
| 6,052,568 A | * | 4/2000 | Williams | 455/126 |
| 6,188,716 B1 | * | 2/2001 | Emery et al. | 375/147 |
| 2002/0132590 A1 | * | 9/2002 | Marshall | 455/73 |

* cited by examiner

Primary Examiner—William Trost
Assistant Examiner—Congvan Tran
(74) Attorney, Agent, or Firm—Sughrue Mion, PLLC

(57) ABSTRACT

A heterodyne radio receiver, having a broadband IF, in which the outputs from the second down-conversion mixer of the receiver are high pass filtered to select unwanted signals and low pass filtered to select wanted signals, the unwanted signals being up-converted to IF in an up-conversion mixer, phase shifted and added in anti-phase to an input or inputs of the second down-conversion mixer.

19 Claims, 4 Drawing Sheets

RADIO RECEIVERS

RELATED APPLICATION

This application is a continuation-in-part application of pending application Ser. No. 09/413,725, filed Oct. 7, 1999 now abandon.

BACKGROUND OF THE INVENTION

1. Field of the Invention

This invention relates to radio receivers and it has particular utility for multi-mode mobile phones but is not so limited.

2. Description of the Related Art

Most modem receivers are based on a conventional heterodyne topology. For a description of the prior art and technological background reference is made to the paper on "Recent Advances in RF Integrated Circuits" by Behzad Razavi published in *IEEE Communications Magazine*, December 1997. U.S. Pat. No. 4,653,117 to Heck also discloses relevant prior art.

These conventional heterodyne receivers make use of a fixed IF and incorporate a narrow band IF filter designed to pass only the wanted signal and reject the large unwanted signals. The large unwanted signals, if not removed by the narrow band IF filter would otherwise compress/saturate the latter stages of the receiver, i.e., the demodulator and so reduce the sensitivity of the receiver. The IF filter is normally a SAW device and so cannot be integrated into a semiconductor process.

Receivers designed to operate with networks having different radio standards generally have different data bandwidths and so the IF filter bandwidth would need to be changed to accommodate operation with the different bandwidths. Under existing arrangements the changes in IF filter bandwidth needed for multi-mode radio would require a plurality of SAW filters.

The following abbreviations and terminology are used herein:
GSM—Global System for Mobile communications, (formerly Groupe Special Mobile)
SAW—Surface acoustic wave
LNA—Low noise amplifier
ASIC—Application specific integrated circuit
IF—ntermediate frequency
RF—Radio frequency
MULTI-MODE—This describes herein a capability to accommodate a number of different data bandwidths rather than different methods of multiple access. The receiver is not limited, however, to any particular multiple access method.

SUMMARY OF THE INVENTION

An object of the present invention is to provide a receiver with broadband IF and multi-mode capability which obviates the need for IF filters and can be implemented fully in ASIC. A further object of the invention is an improved multi-mode homodyne receiver. Further advantages anticipated for the invention are improved flexibility of frequency planning, reduction of the pass band group delay ripple normally associated with SAW filters and cost reduction through the elimination of SAW filters.

According to one aspect of the invention there is provided a heterodyne radio receiver, having a broadband IF, in which the outputs from the second down-conversion mixer of the receiver are high pass filtered to select unwanted signals and low pass filtered to select wanted signals, the unwanted signals being up-converted to IF in an up-conversion mixer, phase shifted and added in anti-phase to an input or inputs of the second down-conversion mixer.

According to a further aspect of the invention there is provided a homodyne radio receiver in which the outputs from the down-conversion mixer of the receiver are high pass filtered to select unwanted signals and low pass filtered to select wanted signals, the unwanted signals being up-converted to RF in an up-conversion mixer, phase shifted and added in anti-phase to an input or inputs of the down-conversion mixer.

BRIEF DESCRIPTION OF THE DRAWINGS

Examples of the invention will now be described with reference to the figures in which like reference numerals identify identical elements and wherein.

DETAILED DESCRIPTION OF THE INVENTION

Figure 1:
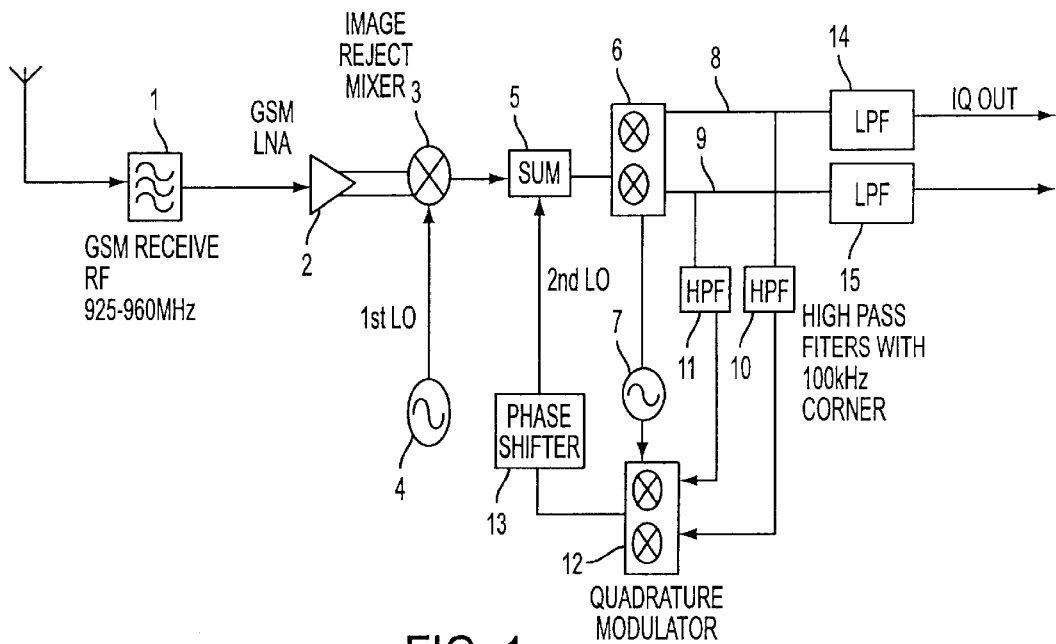
FIG. 1 is a block diagram of a heterodyne receiver constructed in accordance with the invention.

With reference to FIG. 1, a receiver system based on a broadband IF receiver is shown and comprises pre-selector filter 1, LNA 2, first down-conversion mixer 3, first local oscillator (LO) 4, summer 5, second (last) down-conversion mixer 6, second LO 7, I and Q baseband outputs 8 and 9, high pass filters 10 and 11, up-conversion mixer 12, phase shifter 13 and low pass filters 14 and 15.

In this type of system the whole of the wanted band, i.e., 25 MHz for GSM, is mixed down from the incoming RF to an IF (say 25 MHz). All of the input levels are increased by the LNA and first mixer gain so it would be quite typical for the demodulator to experience interfering levels of 0 dBm. As the typical input compression point of a low current demodulator is −10 dBm saturation would occur under these conditions.

This invention linearises the demodulator function by cancellation of the unwanted products. A feedback loop is implemented around the last down-conversion mixer and for ease of explanation the system will be described starting from the output of the down-conversion mixer.

At the output of the demodulator all the products from the second down-conversion mixer 6, both wanted and unwanted, are produced on the I and Q lines 8 and 9. This baseband energy is high pass filtered in filters 10 and 11 such that the unwanted signals are passed and the desired signals rejected by filters 10 and 11. For example in a GSM receiver the filters 10 and 11 can have a 100 kHz high pass corner frequency. The outputs from filters 10 and 11 are connected to the input I and Q lines of the quadrature modulator, up-conversion mixer 12.

The local oscillator port of the up-conversion mixer 12 is connected to second LO 7, the same LO that is used by the second down-conversion mixer 6 so that at the output of the up-conversion mixer 12 the unwanted products are reconstructed at the IF frequency. The output of up-conversion mixer 12 is connected to a fixed phase shifter 13, the phase of phase shifter 13 being set so that the total phase shift around the loop is 180 degrees.

The two inputs of unwanted signal products to summer 5, the unwanted signals contained in the broadband IF and the reconstructed unwanted signals fed back, are therefore preferably in complete anti-phase to achieve cancellation. It has been found, however, that a phase change of exactly 180 degrees around the loop is not necessary for the invention to be effective. The output of phase shifter 13 is connected to a summing junction 5 which has high port isolation (i.e., the order of 30 dB). It is at the summing junction that the cancellation of the unwanted product occurs.

The reduction in the levels of unwanted signal products input to the second down-conversion mixer 6 effectively increases the linearity of mixer 6.

The outputs from the second down-conversion mixer 6 are also passed on the I and Q lines 8 and 9 to low pass filters 14 and 15 and then to the usual processing stages which are described, e.g., in "Mobile Radio Communications" published by John Wiley & Sons, Raymond Steele (Ed.), 1992. The low pass filters 14 and 15 and the high pass filters 10 and 11 may be active filters and may be constructed as MMIC active filters, a description of which can be found in *IEEE Transactions on Microwave Theory and Techniques,* Volume 37, Number 12, December 1989, Manfred J. Schindler and Yusuke Tajima.

The receiver may be programmed to change the corner frequencies of low pass filters 14 and 15 and high pass filters 10 and 11 thereby automatically to select the passband required for a particular mode of operation.

Figure 2:
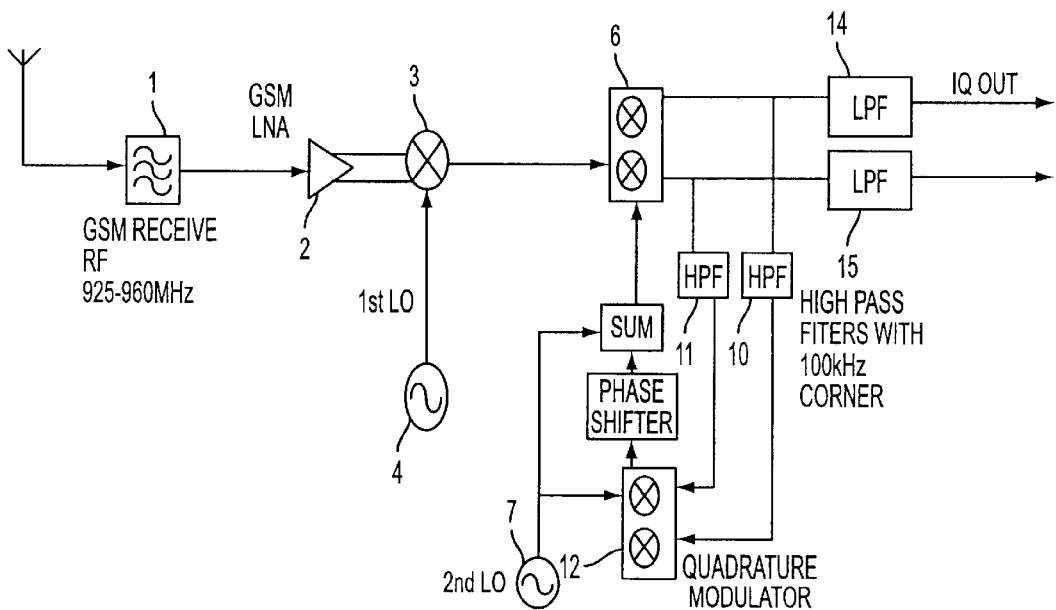
FIG. 2 is a block diagram of a heterodyne receiver constructed in accordance with a further implementation of the invention.

With reference to FIG. 2, a receiver block diagram shows a further example of a receiver which allows the invention more easily to be implemented by means of a semiconductor process. The principle of operation for the receiver of FIG. 2 remains the same as that for the receiver shown in FIG. 1. Cancellation of the unwanted signals by feedback still occurs but in the receiver of FIG. 2 the unwanted signals are cancelled within the second down-conversion mixer 6 rather than at its input.

Consider the output of second down-conversion stage 6 where both the wanted and unwanted products are produced. The high pass filters 10 and 11 connected to the output I and Q lines from second down-conversion stage 6 pass the unwanted signals to the input of up-conversion mixer 12. The output from the second local oscillator LO 7 is fed as an input to up-conversion mixer 12 and LO 7 is fed also via summer 5 to the down-conversion mixer 6. The unwanted signals are reconstructed at their original IF frequency in up-conversion mixer 12. These unwanted signals at the output of up-conversion mixer 12 are phase shifted in phase shifter 13 with a fixed phase shift so that the total phase around the loop is equal to 180 degrees.

The output of phase shifter 13 is summed with the LO 7 output to produce a "LO signal plus unwanted signal" as an input to the down-conversion mixer 6 LO port. Cancellation of the unwanted signals is effected within the demodulator through the process of destructive interference thereby effectively linearising down-conversion mixer 6. In the receiver arrangement of FIG. 2 the summing junction 5 operates at lower power levels than in the arrangement of FIG. 1 and so may more easily be implemented in a semiconductor process.

Figure 3:
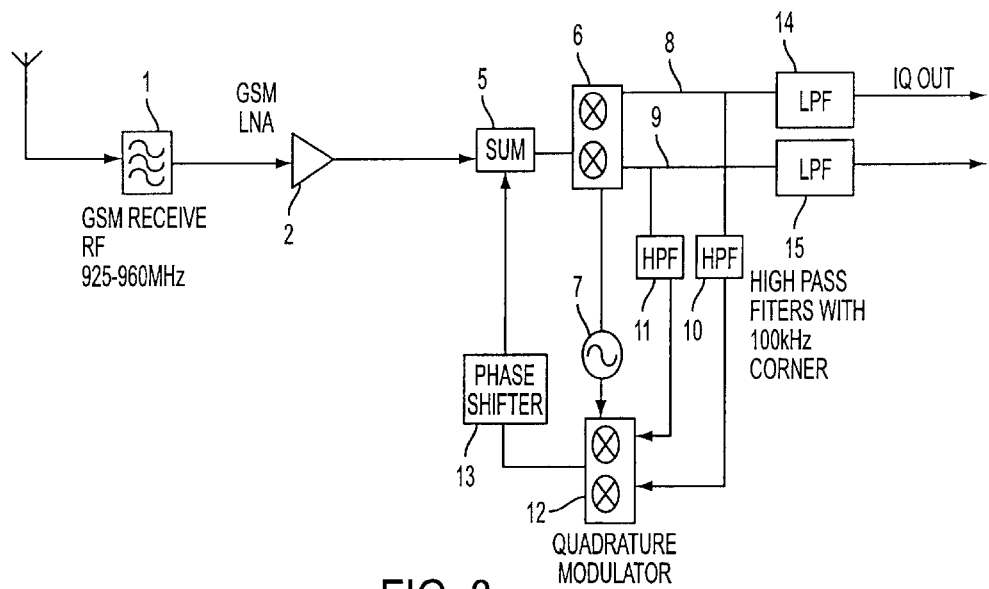
FIG. 3 is a block diagram of a homodyne receiver constructed in accordance with the invention.
Figure 4:
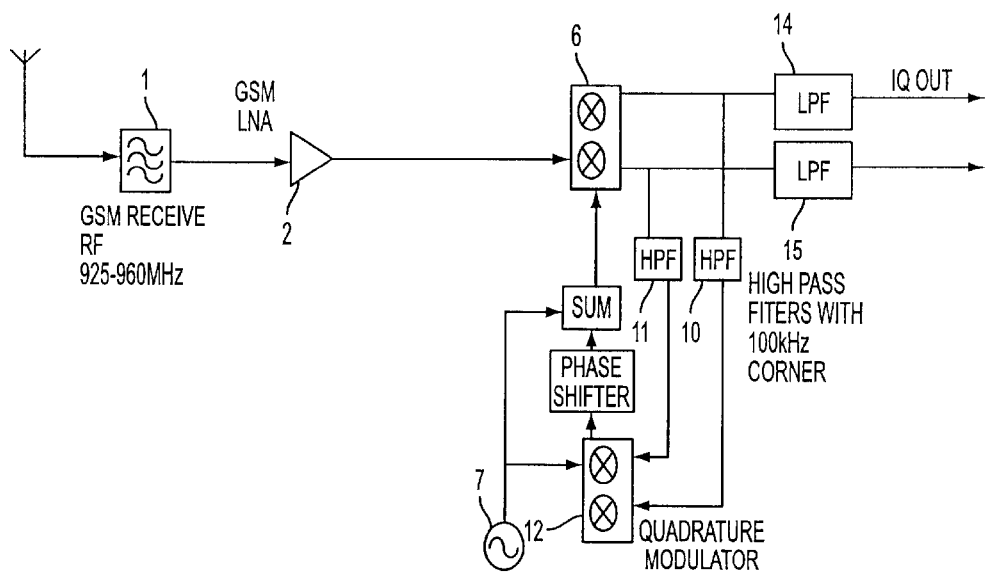
FIG. 4 is a block diagram of a homodyne receiver constructed in accordance with a further implementation of the invention.

The receivers shown in FIGS. 3 and 4 are homodyne receivers and the incoming RF is converted directly to baseband by a single down-conversion mixer. A single local oscillator with output frequency at RF is used. The up-conversion mixers for the homodyne receivers reconstruct at RF the unwanted baseband signals from the high pass filters.

The loop from the output of the last (single) down-conversion mixer through high pass filters, up-conversion mixer, phase shifter and summer to an input of the down-conversion mixer is as described above for the heterodyne receivers. In the receiver of FIG. 3, the up-converted unwanted signals are added at RF in anti-phase to the RF input of the down-conversion mixer. In the receiver of FIG. 4 the up-converted unwanted signals at RF are combined with the local oscillator output prior to being added in anti-phase to the local oscillator input of the down-conversion mixer.

Owing to the port isolation (around 30 dB) of the summing junctions and mixers the embodiments described above demand that a considerable level of gain be generated at baseband. The generation of high levels of gain at baseband can introduce additional design difficulties, e.g., a large initial dc offset to be removed by calibration.

Figure 5:
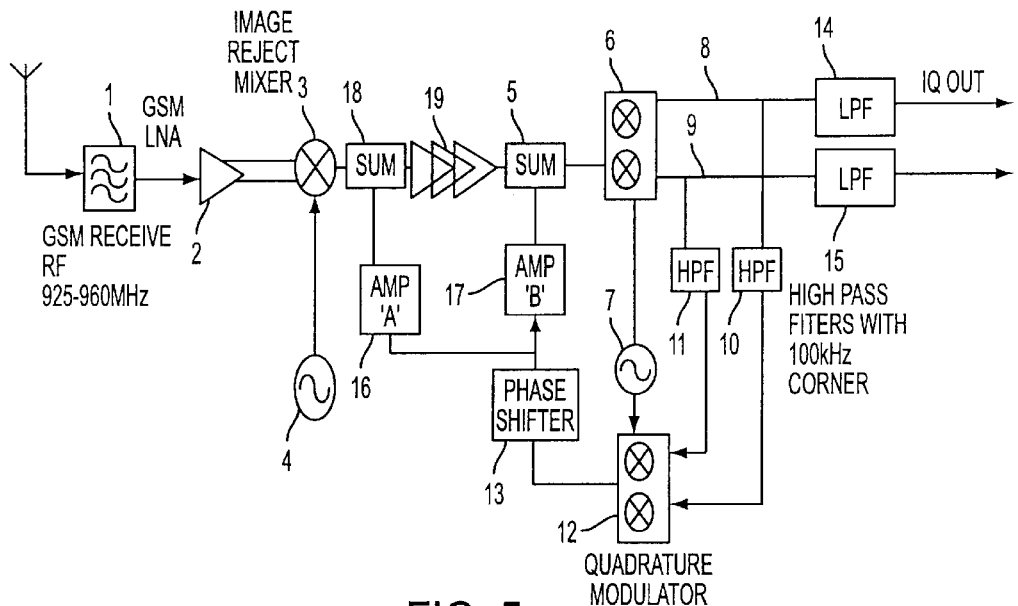
FIG. 5 is a block diagram of a heterodyne receiver with multiple loop feedback.

With reference to the heterodyne receiver of FIG. 5, the up-converted unwanted signals are added in anti-phase to the broadband IF input of the second down-conversion mixer by a plurality of summing junctions. The unwanted signals in the output from second down-converter 6 are passed via high pass filters 10 and 11 to up-conversion mixer 12 in the same manner as in the embodiments shown in FIGS. 1 to 4. The output from up-conversion mixer 12 is fed to phase shifter 13 and the output from phase shifter 13 is supplied as an input to both amplifier 16 and amplifier 17. Amplifier 16 feeds summer 18 and amplifier 17 feeds summer 5. The receiver of FIG. 5 enables the required gain to be generated at IF by means of multiple loop feedback and simplifies the baseband design. Additionally the port isolation is effectively doubled (to about 60 db).

Figure 6:
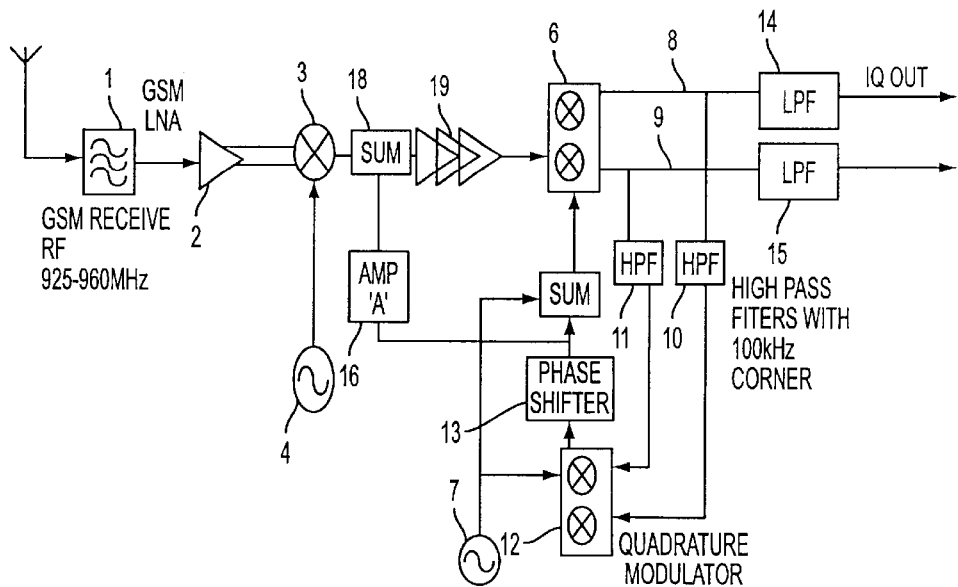
FIG. 6 is a block diagram of a heterodyne receiver constructed in accordance with a further implementation of multiple loop feedback.

With reference to FIG. 6, the unwanted signals up-converted to IF in up-conversion mixer 12 are phase shifted in phase shifter 13 and added in anti-phase to the IF input and the local oscillator input of the second down-conversion mixer.

Figure 7:
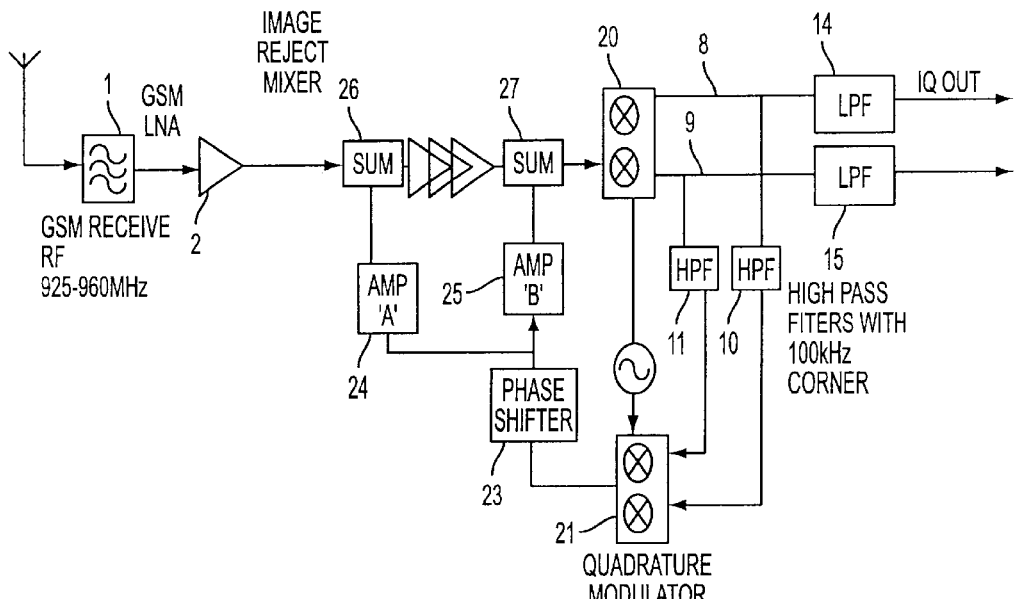
FIG. 7 is a block diagram of a homodyne receiver with multiple loop feedback.

FIG. 7 shows the application of multiple feedback loops to provide anti-phase addition of the unwanted signals to the RF input of the single down-converter mixer. The unwanted signals filtered at baseband at 8 and 9 by high pass filters 10 and 11 are upconverted to RF in up-conversion mixer 21, phase shifted in phase shifter 2, amplified in amplifiers 24 and 25 and applied to summers 26 and 27.

Figure 8:
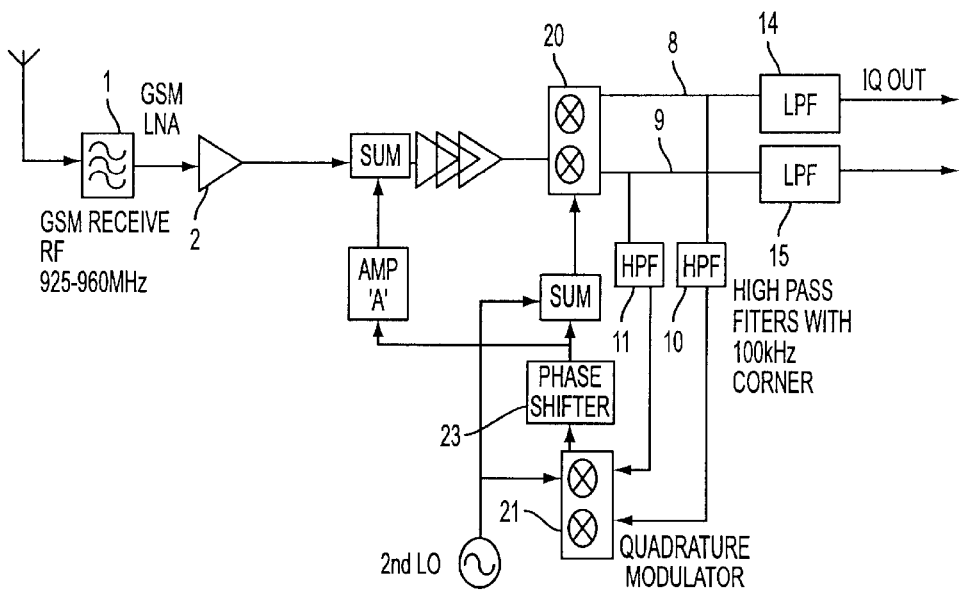
FIG. 8 is a block diagram of a homodyne receiver constructed in accordance with a further implementation of multiple loop feedback.

A homodyne radio receiver is shown in FIG. 8 in which the outputs from the down-conversion mixer of the receiver are high pass filtered to select unwanted signals and low-pass filtered to select wanted signals, the unwanted signals being up-converted to RF in an up-conversion mixer, phase shifted and added in anti-phase to the RF input and to the local oscillator input of the down-conversion mixer.

In the block diagram of FIG. 8 the up-converted unwanted signals at RF are added in anti-phase to both the RF input and the local oscillator input of the single down-converter mixer 20.

What is claimed is:

1. A heterodyne radio receiver, having a broadband IF, in which the outputs from a down-conversion mixer of the receiver are high pass filtered to select unwanted signals and low pass filtered to select wanted signals, the unwanted signals being up-converted to IF in an up-conversion mixer, phase shifted and added in anti-phase to an input or inputs of the down-conversion mixer.

2. A heterodyne radio receiver as in claim 1 in which the up-converted unwanted signals are added in anti-phase to the broadband IF input of a down-conversion mixer by a plurality of summing junctions.

3. A heterodyne radio receiver, having a broadband IF, in which the outputs from a down-conversion mixer of the receiver are high pass filtered to select unwanted signals and low pass filtered to selected wanted signals, the unwanted signals being up-converted to IF in an up-conversion mixer, phase shifted and added in anti-phase to the IF input and to a local oscillator input of the down-conversion mixer.

4. A heterodyne radio receiver as in claim 3 in which the up-converted unwanted signals are combined with a local oscillator output prior to being added in anti-phase to the local oscillator input of the down-conversion mixer.

5. A heterodyne radio receiver as in claim 3 in which the local oscillator output, with which the up-converted unwanted signals are combined prior to being added in anti-phase to the local oscillator input of the down-conversion mixer, is the local oscillator input to the up-conversion mixer for the unwanted signals being up-converted to IF.

6. A heterodyne radio receiver as in claim 1 in which the anti-phase addition of unwanted up-converted signals to the down-conversion mixer is by means of multiple loop feedback.

7. A homodyne radio receiver in which the outputs from a down-conversion mixer of the receiver are high pass filtered to select unwanted signals and low pass filtered to select wanted signals, the unwanted signals being up-converted to RF in an up-conversion mixer, phase shifted and added in anti-phase to an input or inputs of the down-conversion mixer.

8. A homodyne radio receiver as in claim 7 in which the up-converted unwanted signals are added in anti-phase to the broadband IF input of the down-conversion mixer by a plurality of summing junctions.

9. A homodyne radio receiver in which the outputs from a down-conversion mixer of the receiver are high pass filtered to select unwanted signals and low pass filtered to select wanted signals, the unwanted signals being up-converted to RF in an up-conversion mixer, phase shifted and added in anti-phase to the RF input and to a local oscillator input of the second down-conversion mixer.

10. A homodyne radio receiver as in claim 9 in which the local oscillator output, with which the up-converted unwanted signals are combined prior to being added in anti-phase to the local oscillator input of the down-conversion mixer, is the local oscillator input to the up-conversion mixer for the unwanted signals being up-converted to RF.

11. A homodyne radio receiver as in claim 7 in which the anti-phase addition of unwanted up-converted signals to the down-conversion mixer is by means of multiple loop feedback.

12. A radio receiver as in claim 1 in which the baseband outputs from the last down-conversion stage of the receiver are filtered by means of active filters.

13. A radio receiver as in claim 1 in which the filters are MMIC filters.

14. A radio receiver as in claim 1 programmed to change the corner frequencies of low pass filters and high pass filters automatically to select the passband required for a particular mode of operation.

15. A radio receiver as in claim 1 in which the receiver is implemented as an ASIC.

16. A radio receiver as in claim 7 in which the baseband outputs from the last down-conversion stage of the receiver are filtered by means of active filters.

17. A radio receiver as in claim 7 in which the active filters are MMIC filters.

18. A radio receiver as in claim 7 programmed to change the corner frequencies of low pass filters and high pass filters automatically to select the passband required for a particular mode of operation.

19. A radio receiver as in claim 7 in which the receiver is implemented as an ASIC.

* * * * *